(12) United States Patent
Liu et al.

(10) Patent No.: US 10,276,401 B2
(45) Date of Patent: Apr. 30, 2019

(54) 3D SHIELDING CASE AND METHODS FOR FORMING THE SAME

(71) Applicant: Taiwan Semiconductor Manufacturing Company, Ltd., Hsin-Chu (TW)

(72) Inventors: Monsen Liu, Zhudong Township (TW); Chuei-Tang Wang, Taichung (TW); Lai Wei Chih, Hsin-Chu (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 430 days.

(21) Appl. No.: 15/150,222

(22) Filed: May 9, 2016

(65) Prior Publication Data

US 2016/0254168 A1 Sep. 1, 2016

Related U.S. Application Data

(62) Division of application No. 13/926,938, filed on Jun. 25, 2013, now Pat. No. 9,337,073.

(Continued)

(51) Int. Cl.
| | |
|---|---|
| *H01L 21/48* | (2006.01) |
| *H01L 23/538* | (2006.01) |
| *H01L 23/552* | (2006.01) |
| *H01L 21/683* | (2006.01) |
| *H01L 25/00* | (2006.01) |

(Continued)

(52) U.S. Cl.
CPC ........ *H01L 21/4817* (2013.01); *H01L 21/486* (2013.01); *H01L 21/4846* (2013.01); *H01L 21/4853* (2013.01); *H01L 21/565* (2013.01); *H01L 21/6835* (2013.01); *H01L 23/5384* (2013.01); *H01L 23/5389* (2013.01); *H01L 23/552* (2013.01); *H01L 24/19* (2013.01); *H01L 25/50* (2013.01); *H01L 21/568* (2013.01); *H01L 23/49816* (2013.01); *H01L 24/16* (2013.01); *H01L 24/32* (2013.01); *H01L 24/73* (2013.01); *H01L 24/81* (2013.01); *H01L 24/92* (2013.01); *H01L 2221/68372* (2013.01); *H01L 2224/12105* (2013.01); *H01L 2224/16225* (2013.01); *H01L 2224/32245* (2013.01); *H01L 2224/73253* (2013.01); *H01L 2224/73267* (2013.01); *H01L 2224/81005* (2013.01); *H01L 2224/92244* (2013.01); *H01L 2225/06517* (2013.01); *H01L 2225/06527* (2013.01); *H01L 2225/06544* (2013.01); *H01L 2225/06582* (2013.01); *H01L 2924/14* (2013.01); *H01L 2924/1431* (2013.01); *H01L 2924/15311* (2013.01);

(Continued)

(58) Field of Classification Search
CPC .................................................... H01L 21/48
See application file for complete search history.

(56) References Cited

U.S. PATENT DOCUMENTS

| | | | |
|---|---|---|---|
| 7,381,906 B2 | 6/2008 | Holmberg | |
| 7,518,067 B2 | 4/2009 | Gupta et al. | |

(Continued)

*Primary Examiner* — Marvin Payen
(74) *Attorney, Agent, or Firm* — Slater Matsil, LLP (57) ABSTRACT

A package includes a die, and a molding material molding the die therein. A metal shield case includes a first metal mesh over and contacting the molding material and the die, a second metal mesh underlying the die, and a Through-Assembly Via (TAV) in the molding material and forming a ring encircling the die. The TAV is electrically connected to the first metal mesh and the second metal mesh.

19 Claims, 12 Drawing Sheets

Related U.S. Application Data

(60) Provisional application No. 61/778,291, filed on Mar. 12, 2013.

(51) Int. Cl.
    *H01L 21/56*     (2006.01)
    *H01L 23/00*     (2006.01)
    *H01L 23/498*     (2006.01)

(52) U.S. Cl.
    CPC .................. *H01L 2924/181* (2013.01); *H01L 2924/18161* (2013.01); *Y10T 29/49117* (2015.01)

(56) References Cited

U.S. PATENT DOCUMENTS

| | | |
|---|---|---|
| 7,557,307 B2 | 7/2009 | Nishizawa et al. |
| 8,729,679 B1 | 5/2014 | Phua |
| 2004/0231872 A1 | 11/2004 | Arnold et al. |
| 2011/0278703 A1 | 11/2011 | Pagaila et al. |
| 2012/0075821 A1 | 3/2012 | Pagaila |
| 2012/0139092 A1 | 6/2012 | Su et al. |
| 2014/0225208 A1 | 8/2014 | Gu et al. |
| 2014/0367160 A1 | 12/2014 | Yu et al. |

# 3D SHIELDING CASE AND METHODS FOR FORMING THE SAME

PRIORITY

This application is a divisional of U.S. patent application Ser. No. 13/926,938, filed on Jun. 25, 2013, and entitled "3D Shielding Case and Methods for Forming the Same" which claims the benefit of U.S. Provisional Application No. 61/778,291, filed on Mar. 12, 2013, and entitled "3D Shielding Case and Methods for Forming the Same," which applications are hereby incorporated herein by reference.

BACKGROUND

Electro-Magnetic Interference (EMI) is a common problem in the applications of integrated circuits. The EMI becomes a more severe issue in the applications in which high frequencies are used, for example, in mobile applications in which Radio Frequency (RF) signals are used.

To reduce the EMI between device dies, metal shielding cases are used to shield the device dies. The metal shielding cases are typically formed of iron using stamping process. The metal shielding cases are designed to fit the sizes and the shapes of the device dies that are to be shielded. After the dies are bonded to a Printed Circuit Board, the metal shielding cases are covered on the dies, and are soldered to the PCB. The metal shielding cases provide a two-way shielding, and prevent the dies from interfering with the devices outside of the shielded dies, and prevent the outside devices from interfering with the devices in the shielded dies.

In the conventional metal shielding scheme, the metal shielding cases have to be customized to the shapes and the sizes of dies. With multiple dies on a PCB, which dies have different sizes, a plurality of metal shielding cases with different design is needed. This results in a significant increase in the manufacturing cost of integrated circuits.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A built-in metal shielding case and the method of forming the same are provided in accordance with various exemplary embodiments. The intermediate stages of forming the metal shielding case in a packaging process are illustrated. The variations of the metal shielding case are discussed. Throughout the various views and illustrative embodiments, like reference numbers are used to designate like elements.

Figure 1:
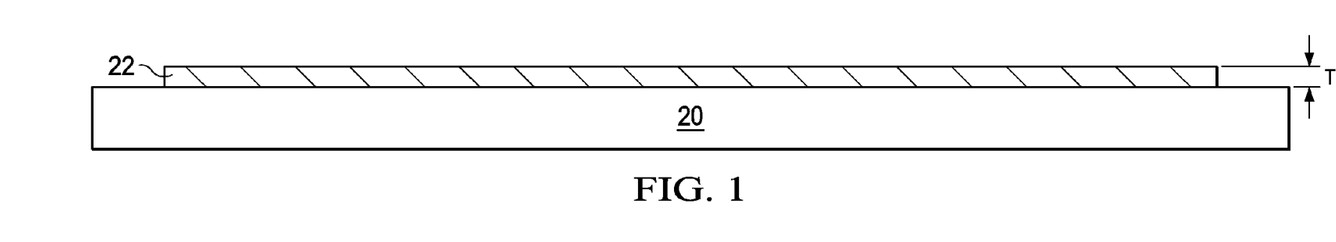
FIGS. 1 through 15 are cross-sectional views and top views of intermediate stages in the manufacturing of a package in accordance with some exemplary embodiments, wherein shielding cases are formed during the packaging process.

FIGS. 1 through 15 are cross-sectional views and top views of intermediate stages in the manufacturing of a package including a built-in metal shielding case in accordance with some exemplary embodiments. FIG. 1 illustrates carrier 20, and metal foil 22 on carrier 20. Carrier 20 may be a glass carrier, a ceramic carrier, or the like. Metal foil 22 may be a copper foil, for example, although it may also be formed of other conductive materials. Thickness T1 of Metal foil 22 may be between about 1 μm and about 20 μm. It is appreciated, however, that the values recited throughout the description are merely examples, and may be changed to different values. In some embodiments, there is an adhesive layer (not shown) used for attaching metal foil 22 to carrier 20. The adhesive layer may be formed of, for example, a Ultra-Violet (UV) glue.

Figure 2:
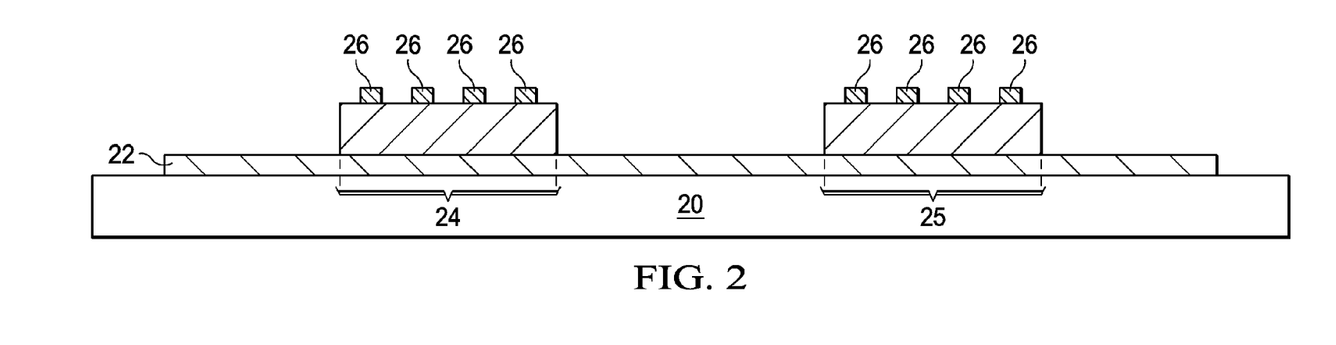

FIG. 2 illustrates the placement of device dies 24 and 25 on metal foil 22. Device dies 24 and 25 are placed with the back surfaces facing metal foil 22, and hence the back surfaces of dies 24 and 25 are level with each other. Device dies 24 and 25 may be logic device dies including logic transistors therein. In some exemplary embodiments, device dies 24 and 25 are dies that are designed for mobile applications, and may include a Power Management Integrated Circuit (PMIC) die and a Transceiver (TRX) die, for example. Although two dies 24 and 25 are illustrated, more dies may be placed over metal foil 22 and level with each other. Furthermore, there may be an array of dies 24 identical to each other and an array of dies 25 identical to each other, wherein each pair of dies 24 and 25 will be used to form a package.

In some exemplary embodiments, metal bumps 26 (such as copper posts) are formed as the top portions of device dies 24 and 25, and are electrically coupled to the devices in device dies 24 and 25. Metal bumps 26 may protrude over the remaining portions of dies 24 and 25. Metal bumps 26 are electrically connected to the integrated circuit devices in dies 24 and 25. Throughout the description, the sides of dies 24 and 25 with metal bumps 26 are referred to as the front sides.

Figure 3:
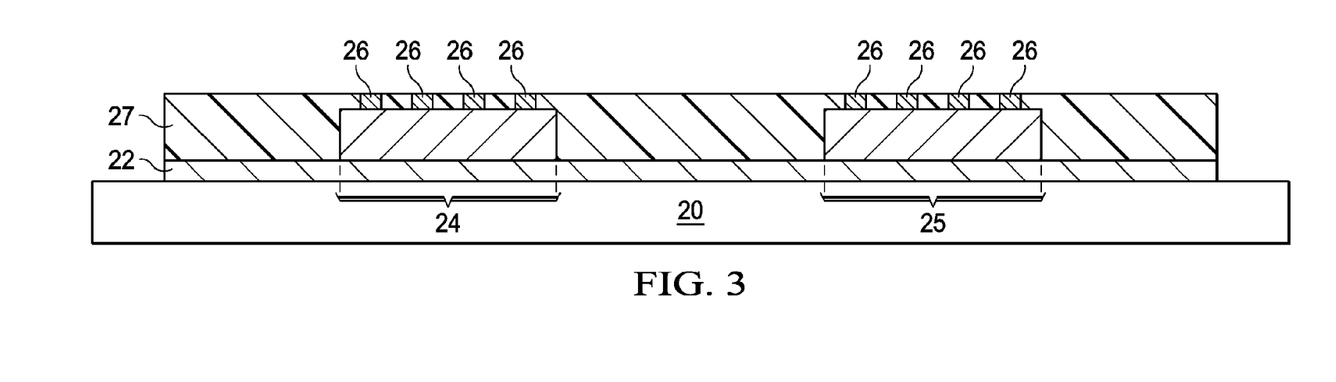

Referring to FIG. 3, molding material 27 is molded on device dies 24 and 25. Molding material 27 fills the gaps between device dies 24 and 25, and may be in contact with metal foil 22. Furthermore, molding material 27 may be filled into the gaps between metal bumps 26. Molding material 27 may include a molding compound, a molding underfill, an epoxy, or a resin. The top surface of molding material 27 is higher than the top ends of metal bumps 26. Next, a thinning step, which may be a grinding step, is performed to thin molding material 27, until metal bumps 26 are exposed.

Figure 4:
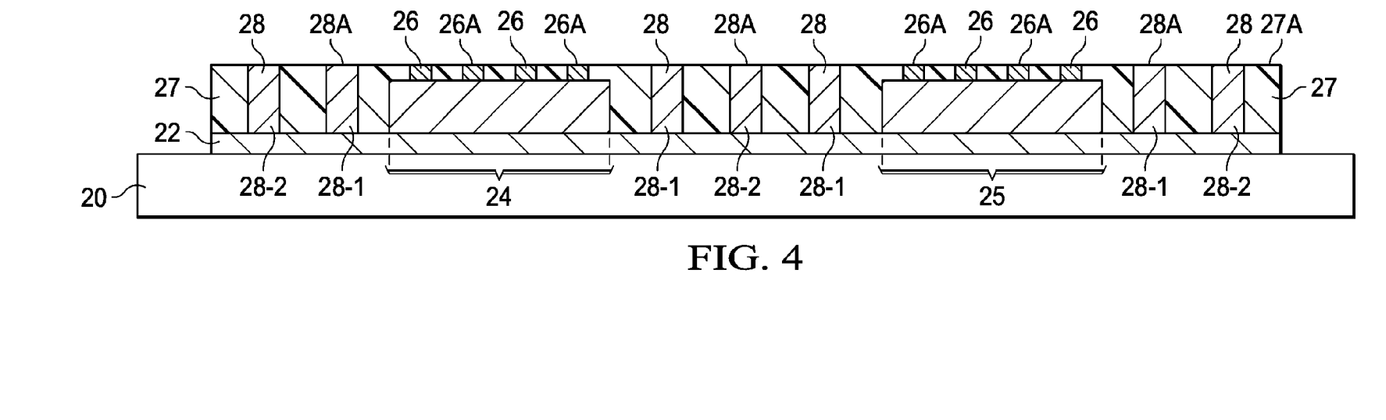

Next, conductive posts 28 are formed in molding material 27. Throughout the description, conductive posts 28 are alternatively referred to as Through-Assembly Vias (TAVs) 28. In some embodiments, TAVs 28 may be formed by plating. The exemplary formation process of TAVs 28 may include forming openings (occupied by TAVs 28) in molding material 27 until metal foil 22 is exposed, and plating TAVs 28 in the openings. The material of TAVs 28 may include copper, aluminum, or the like. In the resulting structure in FIG. 2, the bottom ends of TAVs 28 are substantially level with the bottom surface of device dies 24 and 25. In some embodiments, a planarization is performed to level the top ends 28A of TAVs 28 with the top ends 26A of metal bumps 26, and with top surface 27A of molding material 27. TAVs 28 may include metal posts 28-1 and metal rings 28-2, wherein the top view shapes of TAVs 28-1 and 28-2 are illustrated in FIG. 10.

Figure 5:
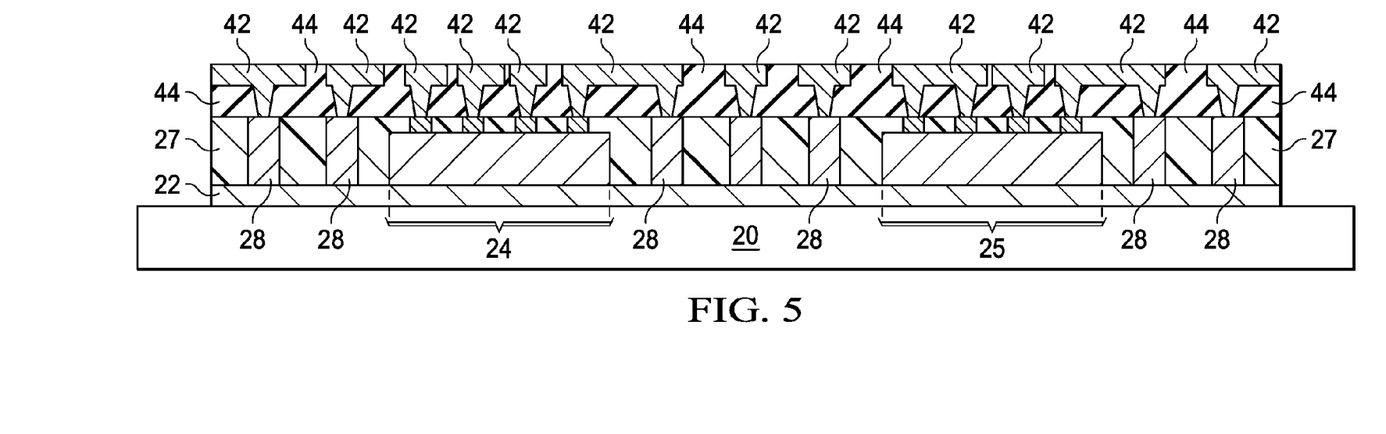

Next, referring to FIG. 5, Redistribution Lines (RDLs) 42 are formed over molding material 27 to connect to metal bumps 26 and TAVs 28. RDLs 42 may also interconnect metal bumps 26 and TAVs 28. RDLs 42 are formed in dielectric layers 44. In some embodiments, RDLs 42 are formed by depositing metal layers, patterning the metal layers, and filling the gaps between RDLs 42 with dielectric layers 44. In alternative embodiments, RDLs 42 and dielectric layers 44 are formed using damascene processes. RDLs 42 may comprise a metal or a metal alloy including aluminum, copper, tungsten, and/or alloys thereof.

Figure 6:
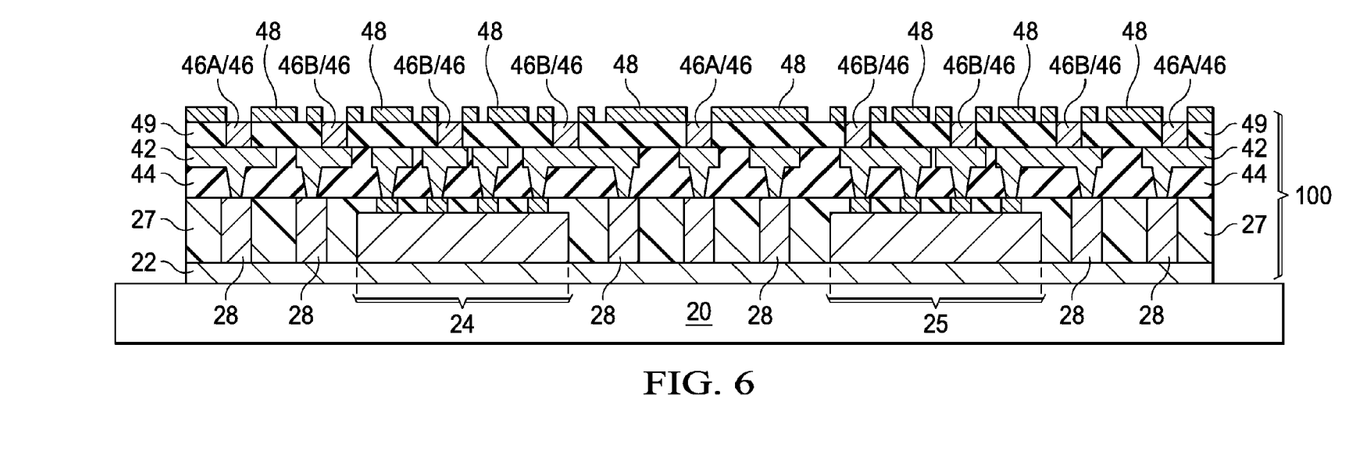

FIG. 6 illustrates the formation of Under-Bump Metallurgies (UBM) 46 (including 46A and 46B) and ground mesh 48. Throughout the description, the terms "ground mesh" and "metal mesh" are interchangeably used. The formation of UBMs 46 and ground mesh 48 may include forming and patterning dielectric layer 49 over the structure in FIG. 5, and depositing a seed layer (such as a titanium layer and an overlying copper layer, which are not shown) over dielectric layer 49. A patterned photo resist (not shown) is then formed over the seed layer, and a metallic material is plated in the patterned photo resist. The photo resist is then removed, and the portions of the seed layer covered by the photo resist are removed. The remaining portions of the plated metallic material form UBMs 46 and ground mesh 48. UBMs 46A are physically and electrically connected to ground mesh 48, and may be used for electrical grounding and heat dissipation. UBMs 46B are physically disconnected and electrically insulated from ground mesh 48, and may be used for the connection of signal-transmission lines. Throughout the description, the structure shown in FIG. 6 is referred to as composite wafer 100.

Figure 7:
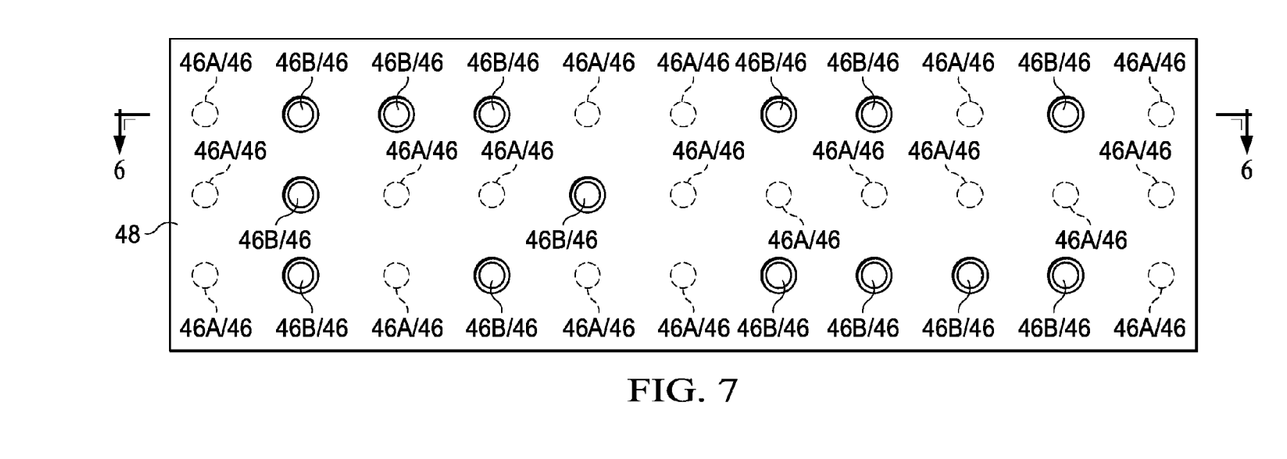

FIG. 7 illustrates a top view of the structure in FIG. 6. The cross-sectional view in FIG. 6 is obtained from the plane crossing line 6-6 in FIG. 7. As shown in FIG. 7, ground mesh 48 forms a large metal foil. In some embodiments, all the portions of ground mesh 48 are connected into a single integrated piece, although they may form a plurality of pieces. UBMs 46A, which are integrated portions of metal mesh 48, connect metal mesh 48 to the underlying TAVs 28 and metal bumps 26 (FIG. 6). UBMs 46B are separated from ground mesh 48 by spaces. The total top-view area of ground mesh 48 may be greater than about 50 percent the total top-view area of composite wafer 100. In some embodiments, each of the UBMs 46B is spaced apart from the rest of the UBMs 46B by ground mesh 48. Furthermore, in some exemplary embodiments, no two UBMs 46B are next to each other without a portion of ground mesh 48 inserted in between, although several UBMs 46 may be close to each other with no ground mesh 48 inserted in between in alternative embodiments.

Figure 8:
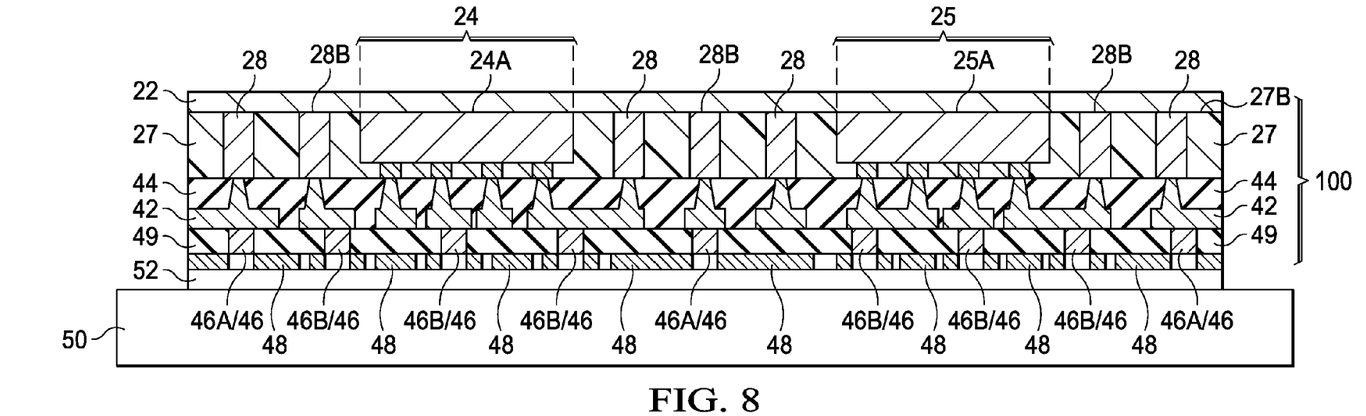

A carrier switch is performed. In the carrier switch process, carrier 50, as shown in FIG. 8, is first attached to composite wafer 100, wherein carriers 50 and carrier 20 (FIG. 6) are on opposite sides of composite wafer 100. Carrier 50 may be attached to composite wafer 100 through adhesive 52, which may be a UV glue, a tape, or the like. Carrier 20 is then detached from composite wafer 100.

After the carrier switch, metal foil 22 is exposed. In the illustrated structure, back ends 28B of TAVs 28 are level with back surface 24A of device die 24 and back surface 25A of device die 25. Back ends 28B of TAVs 28 may also be substantially level with surface 27B of molding material 27. Furthermore, TAVs 28 are connected to the bottom surface of metal foil 22.

Figure 9:
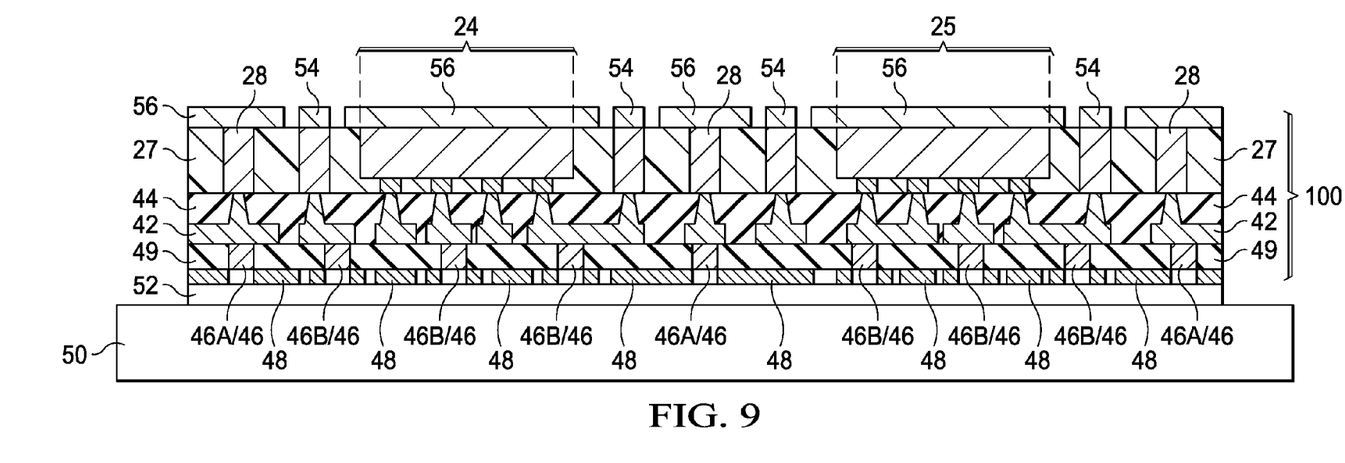

Next, as shown in FIG. 9, an etching process is performed to pattern metal foil 22. Hence, metal foil 22, being patterned, form metal pads 54 and metal mesh 56, which are physically separated from each other and may be electrically disconnected from each other. TAVs 28 include first portions underlying and connected to metal mesh 56, and second portions underlying and connected to metal pads 54.

Figure 10A:
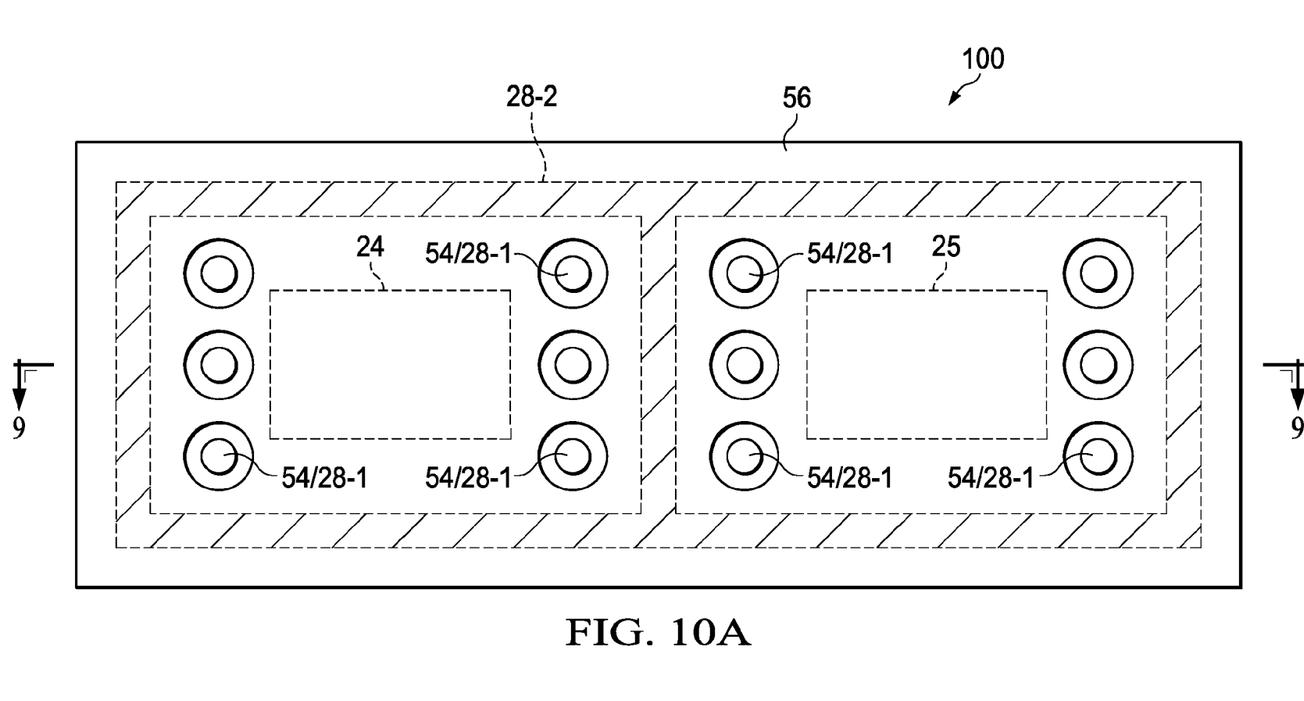

FIG. 10A illustrates a top view of metal pads 54 and metal mesh 56. The cross-sectional view in FIG. 9 may be obtained from the plane crossing line 9-9 in FIG. 10. As shown in FIG. 10A, metal mesh 56 is connected to the underlying TAVs 28-2, and metal pads 54 are connected to the underlying TAVs 28-1. Metal pads 54 are physically separated and are electrically disconnected from ground mesh 48 by spaces. As shown in FIG. 9, metal mesh 56 is over and in physical contact with the back surface of dies 24 and 25. Hence, metal mesh 56 has the function of dissipating the heat generated in dies 24 and 25. FIG. 10A also illustrates that some discrete TAVs (marked as 28-1) have the shape of metal posts. TAVs 28 may also include some TAVs 28-2 that form full rings encircling dies 24 and 25.

Figure 10B:
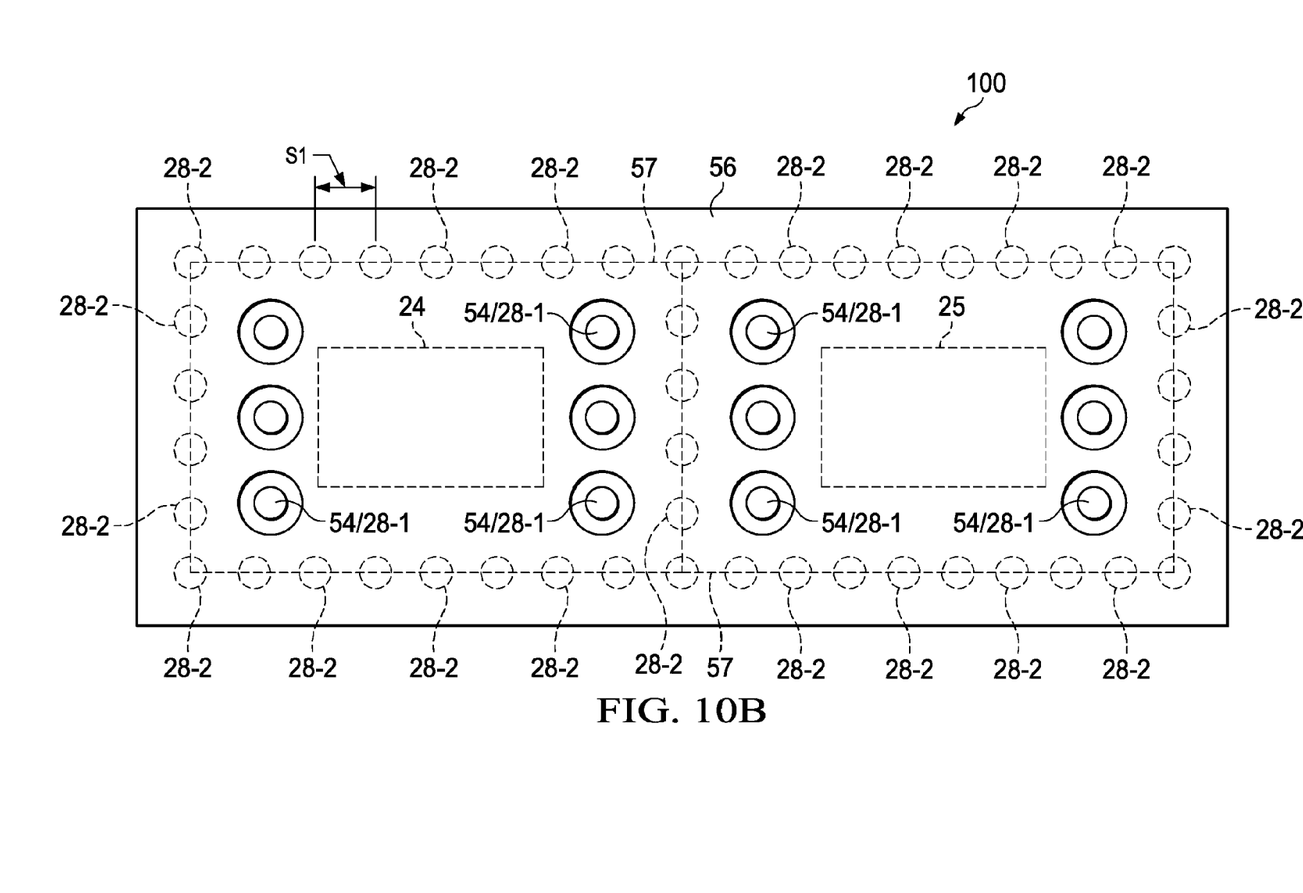

FIG. 10B illustrates a top view of composite wafer 100 in accordance with alternative embodiments, wherein TAVs 28-2, instead of forming full ring, are discrete metal posts that aligned to ring 57, which ring encircles die 24 or 25. Spacing S1 between discrete TAVs 28-2 is small enough for shielding signals. For example, spacing S1 may be smaller than about one fourth of the wave length of the signal to be isolated, which signal may be carried by dies 24 and 25.

In some exemplary embodiments, the total top-view area of metal mesh 56 is greater than about 50 percent the total top-view area of composite wafer 100. Furthermore, each of metal pads 54 may be spaced apart from the rest of the metal pads 54 by metal mesh 56. In some embodiments, no two metal pads 54 are next to each other without a portion of metal mesh 56 inserted in between, although several metal pads 54 may be close to each other with no ground mesh 48 inserted in between.

Figure 11:
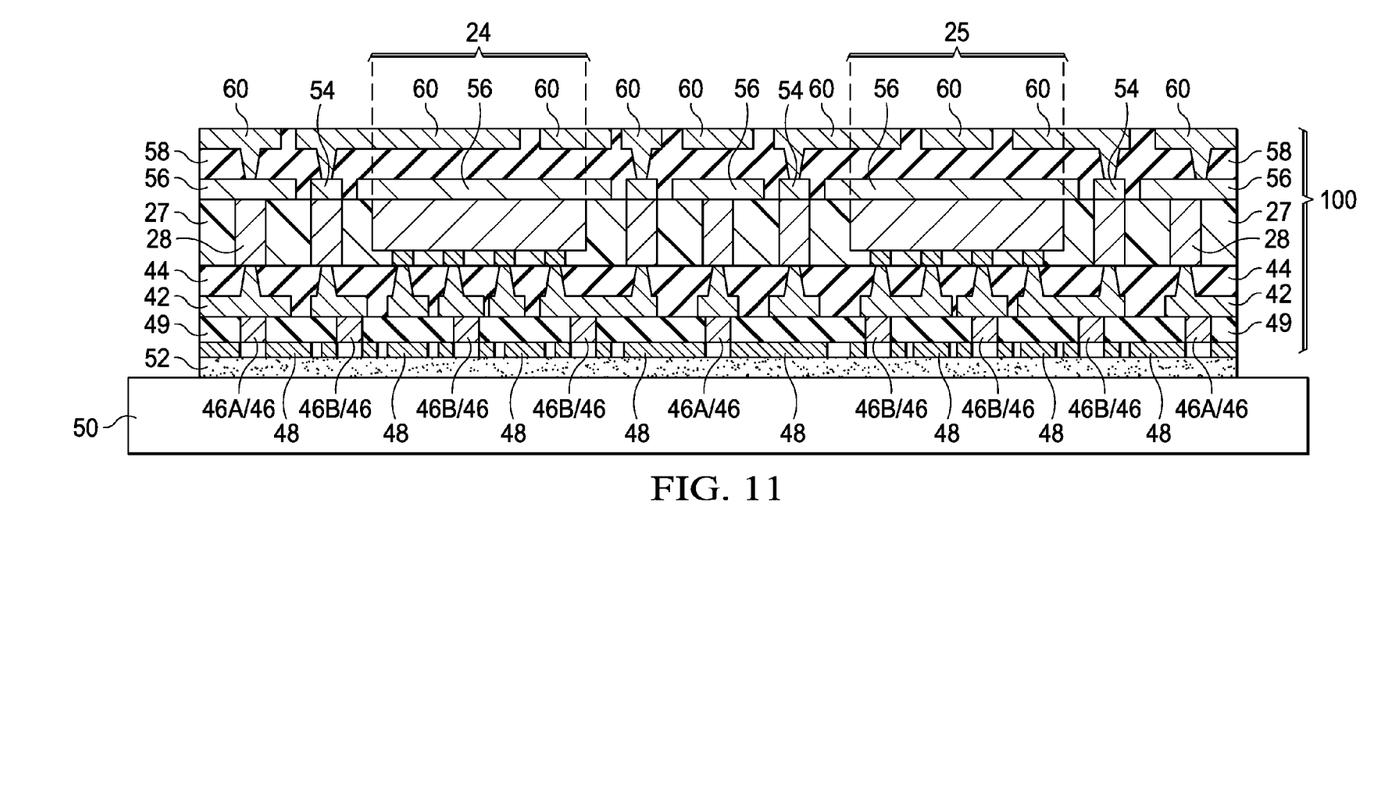

Next, as shown in FIG. 11, dielectric layers 58 and RDLs 60 are formed. In some embodiments, dielectric layers 58 are formed of dielectric materials such as oxides, nitrides, carbides, carbon nitrides, combinations thereof, and/or multi-layers thereof. RDLs 60 are formed in dielectric layer 58 and connected to metal pads 54 and metal mesh 56. Some of RDLs 60 may extend over and aligned to device dies 24 and 25, and some other RDLs 60 may extend beyond the boundaries of dies 24 and 25. Accordingly, RDLs 60 have a fan-out structure.

Figure 12:
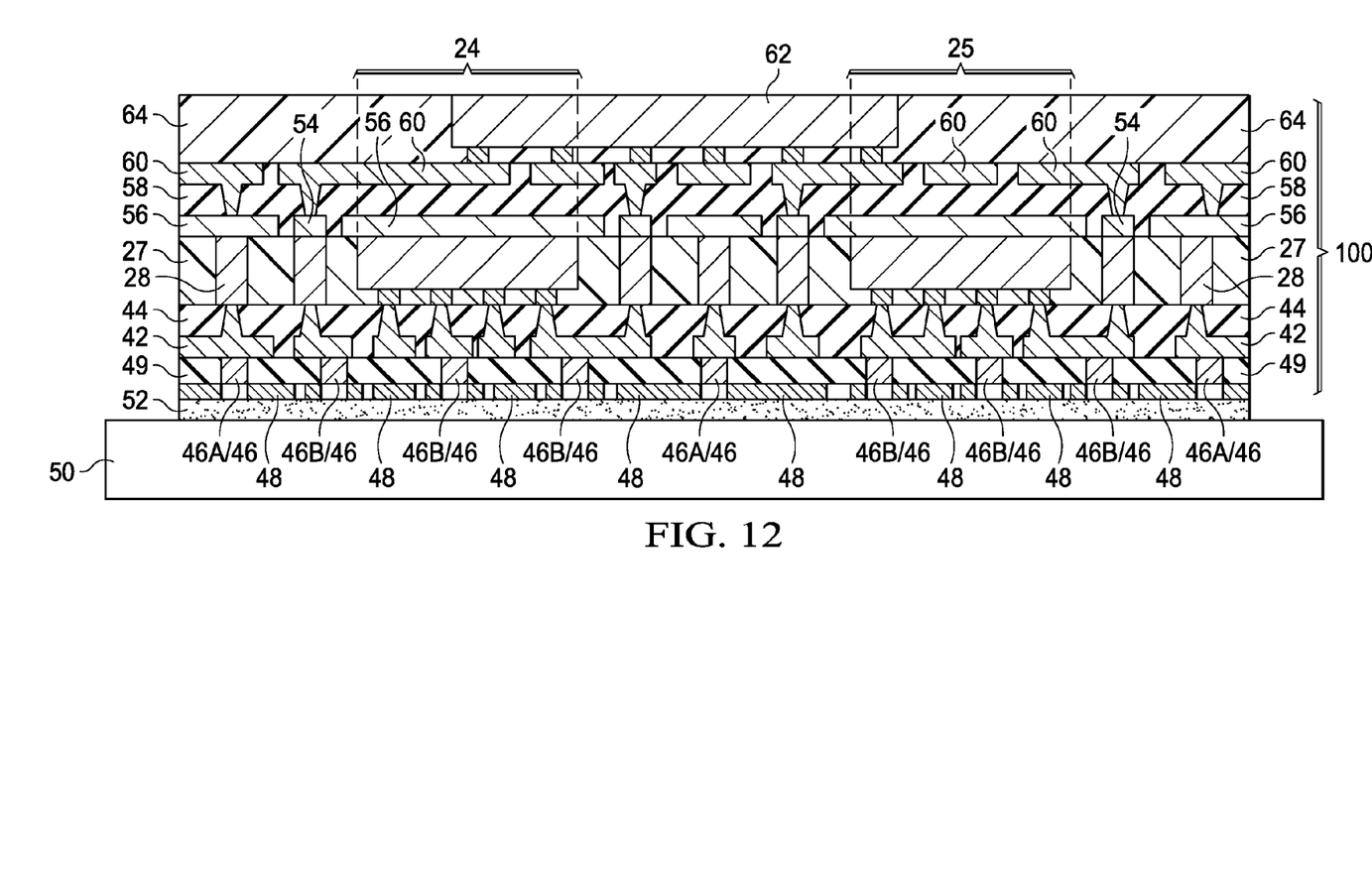
Figure 13:
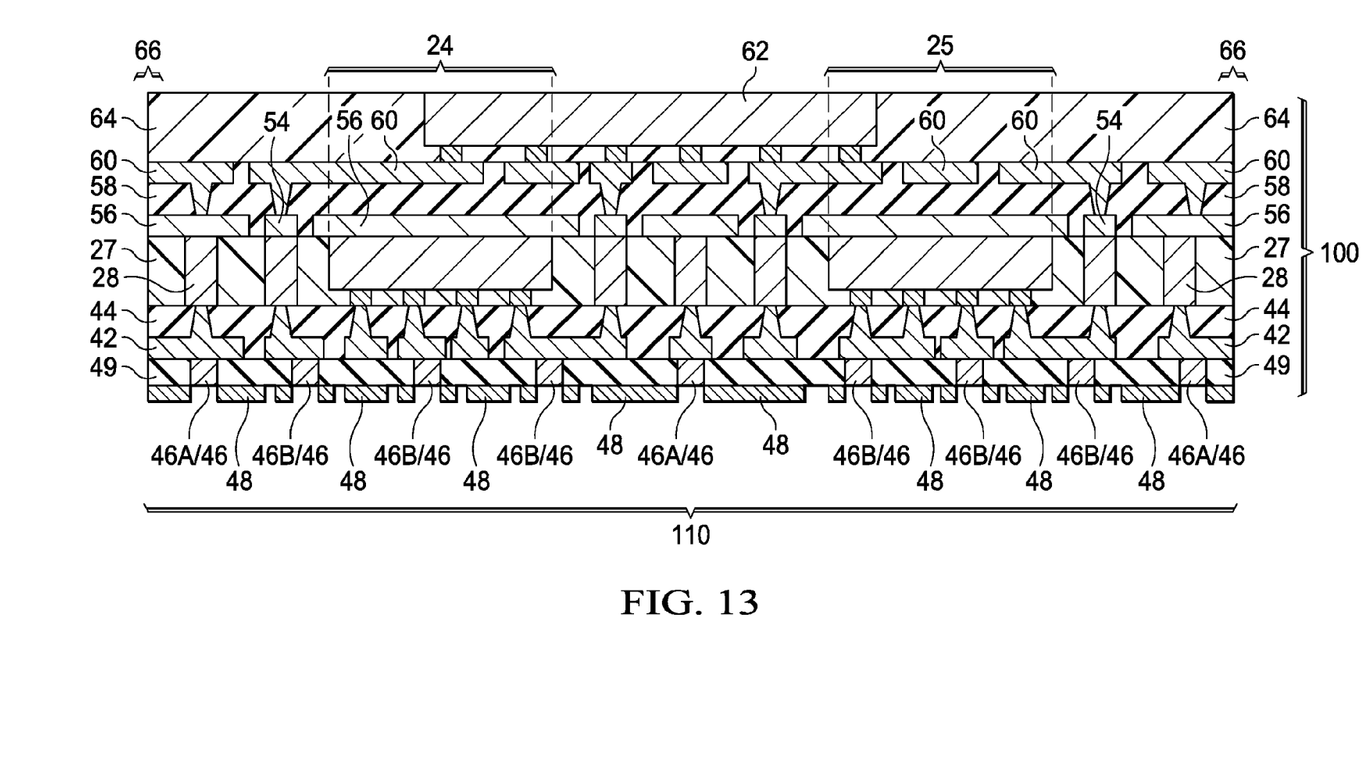

FIG. 12 illustrates the bonding of die 62 to RDLs 60, which bonding may be performed through, for example, solder bonding, metal-to-metal direct bonding, or the like. Molding material 64 is used to mold die 62, RDL 60, and dielectric layers 58. In some embodiments, after the molding process, a planarization is performed, so that the back surface of die 62 is exposed. After the planarization, carrier 50 may be detached from composite wafer 100. The resulting structure is shown in FIG. 13. A die saw is then performed on composite wafer 100 along scribe lines 66. Composite wafer 100 is thus separated into a plurality of packages 110 identical to each other.

Figure 14:
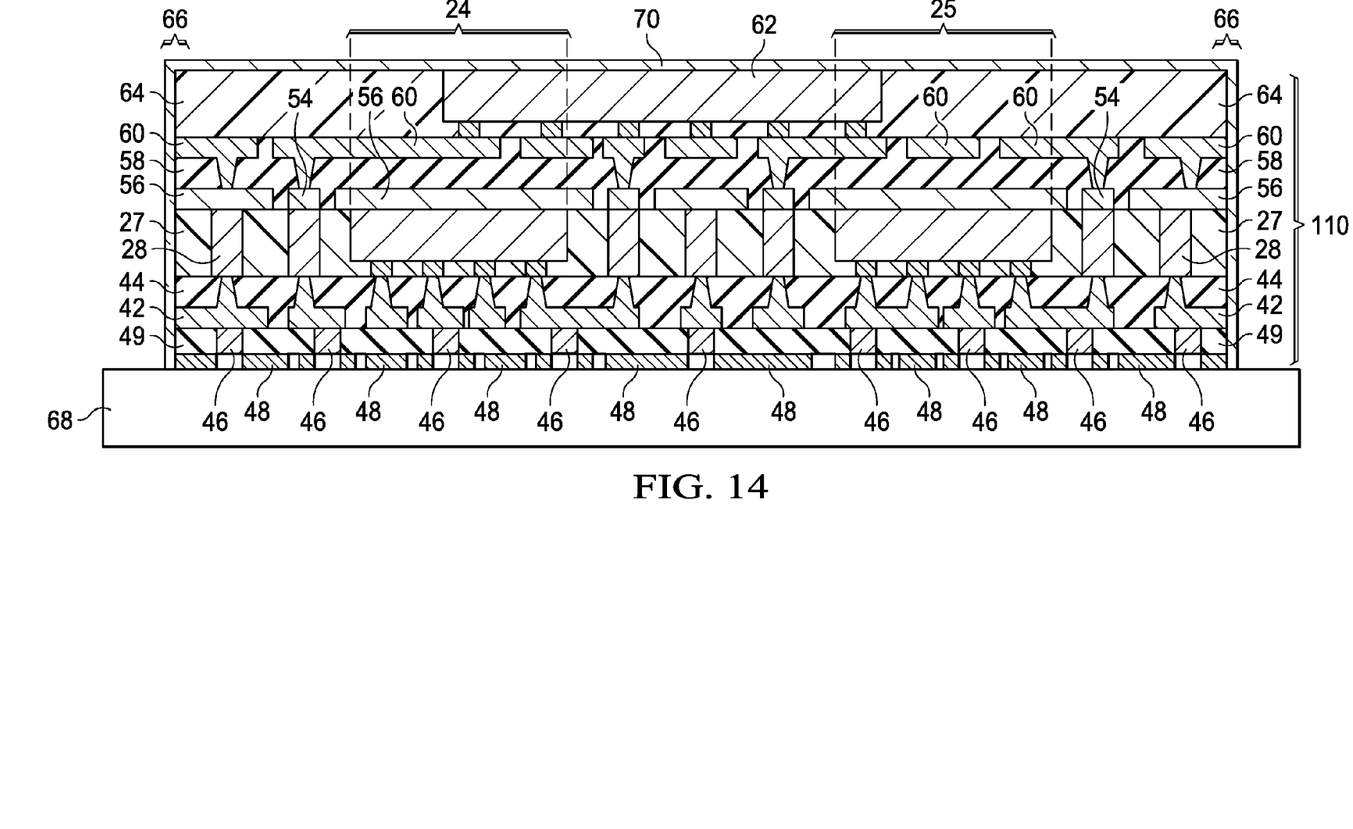

Referring to FIG. 14, package 110 is mounted on carrier 68. Metal shielding film 70 is then formed on the outer surfaces of package 110. In some embodiments, metal shielding film 70 comprises copper, although other metallic materials may be used. Metal shielding film 70 may be formed by Physical Vapor Deposition (PVD), metal spray, plating, or combinations thereof. In the embodiments in which the metal spray is used, a metal-containing spray (a liquid or a gel) such as copper spray is sprayed on the top surface and sidewall surfaces of package 110. The metal spray is then cured, and the remaining substance comprises metal particles (such as copper particles) and some adhesive materials that glue the metal particles together. The resulting cured metal spray is electrical conductive. The metal spray is distinguishable from the pre-formed metal shielding cases that are formed of stamping processes. For example, since metal shielding film 70 is formed by deposition rather than being a stamping process, there is no gap (air space) between metal shielding film 70 and the portion of package 110 enclosed by metal shielding film 70. Furthermore, metal shielding film 70 may include an adhesive material to glue the metal particles together.

The bottom surface of package 110 has no metal shielding film 70 formed thereon, and hence UBMs 46 and ground mesh 48 remain separated from each other. Furthermore, metal shielding film 70 is joined to the edges of ground mesh 48 and metal mesh 56 to form integrated shielding cases. After the formation of metal shielding film 70, package 110 is separated from carrier 68.

Figure 15:
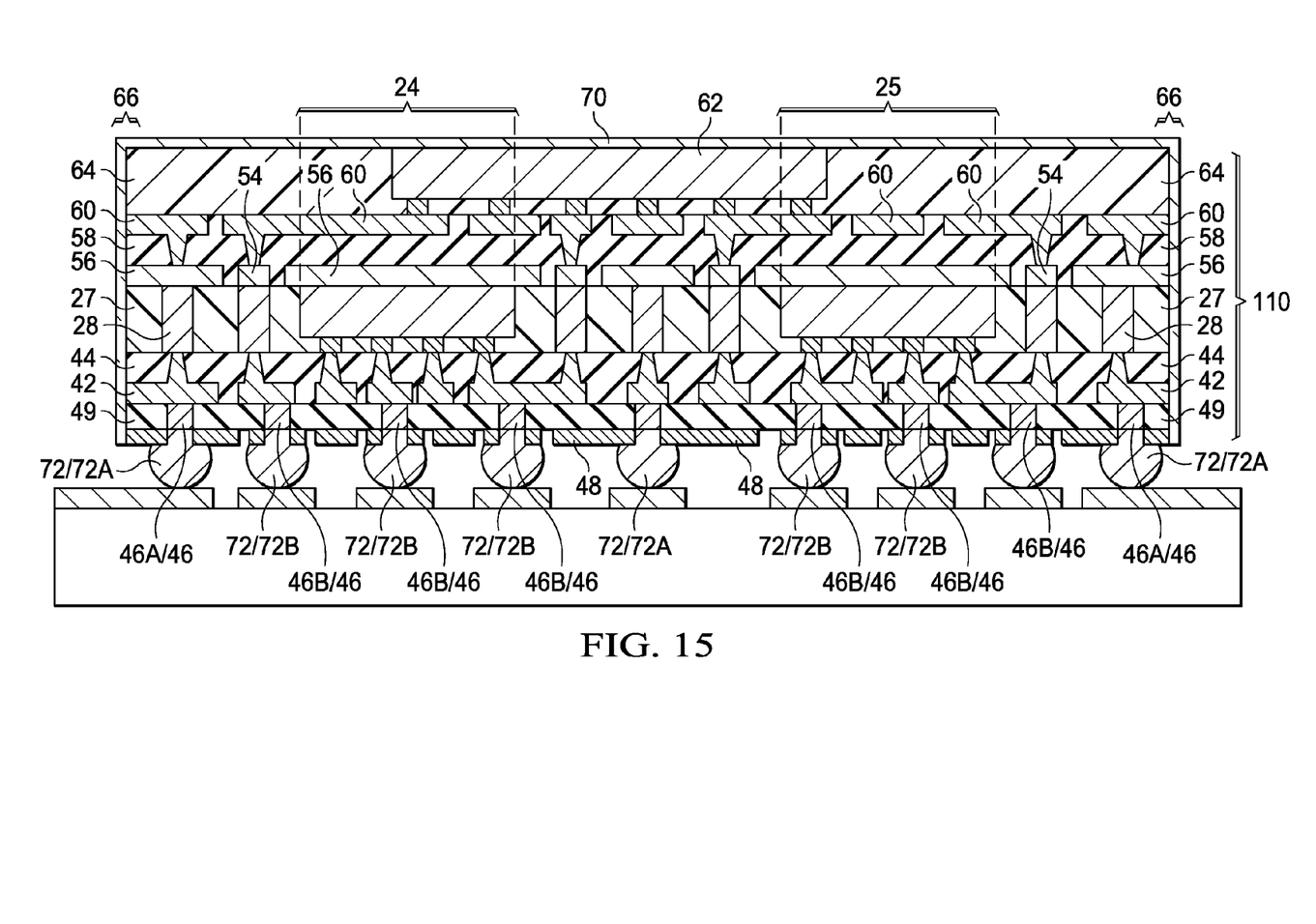

FIG. 15 illustrates the formation of electrical connectors 72 in accordance with some exemplary embodiments. The formation of connectors 72 may include placing solder balls on the exposed portions of UBMs 46A and 46B, and then reflowing the solder balls. In alternative embodiments, the formation of connectors 72 includes performing a plating step to form solder regions on UBMs 46A and 46B, and then reflowing the solder regions. The resulting package 110 may then be bonded to another package component 74, which may be an interposer, a package substrate, a PCB, or the like. Connectors 72 include grounding connectors 72A that connect the electrical ground of package 110 to the ground of package component 74, and connectors 72B that connect the signal lines of package 110 to the signal lines of package component 74.

Figure 16:
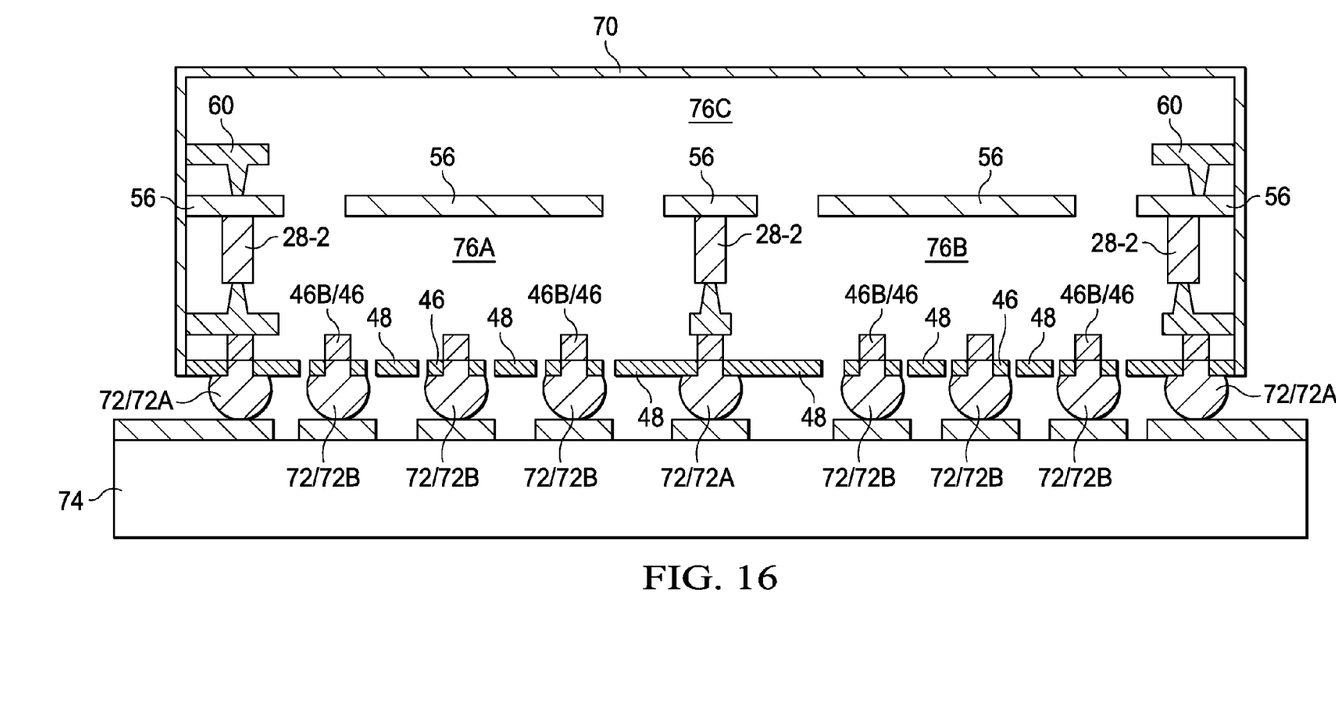
FIG. 16 illustrates an abstract view of the package in accordance with some embodiments, wherein the metal connections in the package are illustrated.

FIG. 16 illustrates an abstract view of the structure in FIG. 15. The structure is simplified, and the RDLs, some TAVs, and dies are not illustrated. As shown in FIG. 16, metal shielding film 70, TSVs 28-2 (which may form circles), metal mesh 56, and ground mesh 48 in combination form metal shielding cases that enclose metal shielding caves 76A, 76B, and 76C therein. Each of metal shielding caves 76A, 76B, and 76C is enclosed by one of the metal shielding cases, which are formed of metal features that may shield electro-magnetic field. The metal shielding structure is a 3D structure. The metal shielding cases are substantially fully enclosed, except that some gaps are left for the routing of signal in and out of the metal shielding cases.

In the embodiments of the present disclosure, the metal shielding cases, instead of being pre-formed, are formed in the package processes. The manufacturing cost of forming the metal shielding cases in accordance with the embodiments is lower than the conventional process including stamping processes, metal shielding cases placement, and soldering the metal shielding case to PCB. The metal shielding cases may form integrated 3D structures, and hence the space occupied of the resulting package is improved. Furthermore, the metal shielding cases are in contact with the back surface of the dies, and hence may improve the heat dissipation of the dies.

In accordance with some embodiments, a package includes a die, and a molding material molding the die therein. A metal shield case includes a first metal mesh over and contacting the molding material and the die, a second metal mesh underlying the die, and a TAV in the molding material and forming a ring encircling the die. The TAV is electrically connected to the first metal mesh and the second metal mesh.

In accordance with other embodiments, a package includes a first die, and a first molding material molding the first die therein. A first metal shield case includes a first metal mesh over and contacting the first molding material and the first die, a second metal mesh underlying the first die, and a TAV forming a ring encircling the first die. The TAV has a top end in contact with a bottom surface of the first metal mesh. The package further includes a second die over the metal shield case, a second molding material molding the second die therein, and a metal shielding film. The metal shielding film includes a top portion over and contacting a top surface of the second molding material, and a sidewall portion contacting sidewalls of the first molding material, sidewalls of the second molding material, edges of the first metal mesh, and edges of the second metal mesh.

In accordance with yet other embodiments, a method includes placing a die over a metal foil, molding the die with a molding material, and forming TAVs in the molding material. The TAVs are electrically coupled to the metal foil, and comprises a TAV ring encircling the die. A first metal mesh and UBMs are formed over and electrically coupled to the TAVs. The metal foil is etched into a second metal mesh and metal pads encircled by the second metal mesh.

One general aspect of embodiments described herein includes a method including: molding a first die with a first molding material, forming through-assembly vias (TAVs) in the first molding material where the TAVs includes a TAV ring encircling the first die, and forming a first metal mesh and under-bump metallurgies (UBMs) over and electrically coupled to the TAVs.

Another general aspect of embodiments described herein includes a method including: encapsulating a first die within a molding material, forming first through-assembly vias (TAVs) in the molding material where the TAVs includes a TAV ring encircling and electrically coupled to the first die, and forming second TAVs in the molding material where the second TAVs are electrically isolated from the first TAVs, and forming a first metal mesh and under-bump metallurgies (UBMs) over and electrically coupled to the second TAVs.

Yet another general aspect of embodiments described herein includes a method, including: encapsulating a die in a molding material; forming a first through assembly via (TAV) in the molding material; forming a second TAV in the molding material, the second TAV being electrically isolated form the first TAV; and forming a first ground mesh over a first side of the molding material, the first ground mesh being electrically isolated from the first TAV and electrically connected to the second TAV.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   molding a first die with a first molding material;
   forming Through-Assembly Vias (TAVs) in the first molding material wherein the TAVs comprises a TAV ring encircling the first die;
   forming a first metal mesh and Under-Bump Metallurgies (UBMs) over and electrically coupled to the TAVs; and
   placing the first die over a metal foil before molding the first die; and etching the metal foil into a second metal mesh and metal pads encircled by the second metal mesh.

2. The method of claim 1 further comprising:
   forming redistribution lines over and electrically coupled to the TAVs;
   bonding a second die to the redistribution lines; molding the second die with a second molding material;
   performing a die sawing to cut through the first and the second molding materials and the metal foil to form a package; and
   forming a metal shielding film on a top surface and sidewalls of the package, wherein the metal shielding film contacts edges of the first metal mesh and the second metal mesh.

3. The method of claim 2, wherein the forming the metal shielding film comprises metal spraying.

4. The method of claim 2, wherein the forming the metal shielding film comprises a deposition step.

5. The method of claim 2 further comprising bonding the package to a package component through solder regions, wherein the solder regions comprise:
   a first solder region electrically connected to the metal shielding film and the first and the second metal meshes; and
   a second solder region electrically coupled to the first die, wherein the second solder region is configured to be used as a signal connection.

6. A method comprising:
   encapsulating a first die within a molding material;
   forming first Through-Assembly Vias (TAVs) in the molding material wherein the TAVs comprises a TAV ring encircling and electrically coupled to the first die; and
   forming second TAVs in the molding material wherein the second TAVs are electrically isolated from the first TAVs; and
   forming a first metal mesh and Under-Bump Metallurgies (UBMs) over and electrically coupled to the second TAVs.

7. The method of claim 6, wherein forming first Through-Assembly Vias (TAVs) includes forming respective openings extending through the molding material to expose a metal foil underlying the molding material and plating a depositing a conductor material in the respective openings.

8. The method of claim 6, wherein the first TAVs and the second TAVs are formed simultaneously.

9. The method of claim 6, wherein the first metal mesh is formed overlying a first side of the molding material and further comprising forming a metal mesh overlying a second side of the molding material, the second side being opposite the first side.

10. The method of claim 9, further comprising forming a redistribution layer over the second side of the molding material.

11. A method, comprising:
    encapsulating a die in a molding material;
    forming a first Through Assembly Via (TAV) in the molding material;
    forming a second TAV in the molding material, the second TAV being electrically isolated form the first TAV; and
    forming a first ground mesh over a first side of the molding material, the first ground mesh being electrically isolated from the first TAV and electrically connected to the second TAV.

12. The method of claim 11, further comprising:
    forming a second ground mesh over a second side of the molding material, opposite the first side of the molding material, the second ground mesh being electrically connected to the second TAV.

13. The method of claim 11, further comprising forming a redistribution layer over the first side of the molding material and electrically connected to the first TAV.

14. The method of claim 11, wherein forming a first ground mesh over a first side of the molding material includes:
    depositing a dielectric layer over the molding material;
    patterning the dielectric layer;
    depositing a seed layer on the patterned dielectric layer;
    forming a patterned photoresist layer on the seed layer;
    plating a metallic material on the seed layer; and
    removing the patterned photoresist layer.

15. The method of claim 12, wherein forming a second ground mesh over a second side of the molding material includes patterning a metal foil upon which the molding material is formed.

16. The method of claim 15, wherein the metal foil is patterned to form the second ground mesh and also to form a metal pad electrically coupled to the first TAV.

17. The method of claim 11, further comprising forming Under Bump Metallurgy (UBM) features simultaneously with forming the first ground mesh.

18. The method of claim 11, further comprising mounting the die to a metal foil prior to encapsulating the die in the molding material.

19. The method of claim 11 wherein the first TAV is in the form of a post and the second TAV is in the form of a ring that surrounds the die.

* * * * *